(12) United States Patent
Keum

(10) Patent No.: US 7,067,431 B2
(45) Date of Patent: Jun. 27, 2006

(54) METHOD OF FORMING DAMASCENE PATTERN IN A SEMICONDUCTOR DEVICE

(75) Inventor: Dong-Yeal Keum, Icheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 301 days.

(21) Appl. No.: 10/626,584

(22) Filed: Jul. 25, 2003

(65) Prior Publication Data

US 2004/0149682 A1    Aug. 5, 2004

(30) Foreign Application Priority Data

Jul. 25, 2002    (KR) ...................... 10-2002-0043797

(51) Int. Cl.
*H01L 21/302*    (2006.01)
(52) U.S. Cl. .................. 438/706; 438/634; 438/691
(58) Field of Classification Search ................ 438/625, 438/634, 635, 636, 640, 675, 706, 710, 691
See application file for complete search history.

(56) References Cited

U.S. PATENT DOCUMENTS

| 5,635,423 | A | 6/1997 | Huang et al. |
| 5,741,626 | A | 4/1998 | Jain et al. |
| 6,251,774 | B1 * | 6/2001 | Harada et al. ............... 438/637 |
| 6,365,529 | B1 | 4/2002 | Hussein et al. |
| 6,576,550 | B1 | 6/2003 | Brase et al. |

FOREIGN PATENT DOCUMENTS

KR    10-2001-0059540    7/2001

* cited by examiner

*Primary Examiner*—Lan Vinh
(74) *Attorney, Agent, or Firm*—Pillsbury Winthrop Shaw Pittman LLP

(57) ABSTRACT

The present invention relates to a method of forming damascene pattern in a semiconductor device, and the method includes forming an insulating layer on a bottom wiring, forming via holes exposing a part of the bottom wiring by removing the insulating layer selectively, filling insides of the via holes to a prescribed thickness, forming an anti-reflection layer on the via holes and the insulating layer, forming a mask pattern for trench etching on the insulating layer on which the anti-reflection layer is formed, and forming a damascene pattern using the mask pattern for trench etching. CD uniformity is improved by minimizing change of the critical dimension of the damascene pattern, thereby increasing reliability of the semiconductor device.

3 Claims, 3 Drawing Sheets

METHOD OF FORMING DAMASCENE PATTERN IN A SEMICONDUCTOR DEVICE

BACKGROUND OF THE INVENTION (a) Field of the Invention

The present invention relates to a method of forming damascene pattern in a semiconductor device, and particularly to a method of forming damascene pattern, which is able to minimize the change of critical dimension of a damascene mask according to the via/contact density.

(b) Description of Related Art

Recently, copper (Cu) wiring process is suggested to improve characteristics of a semiconductor device such as operation speed, resistance, parasitic capacitance between metal layers, while semiconductor devices become integrated and the fabrication technique is advanced. For insulating films, material having low-k (dielectric constant) is highlighted instead of the conventional oxide films for the wiring process of the next generation device.

However, the wring process using copper and material having low-k has a disadvantage that etching characteristic of copper is very poor. In this regard, a method of forming damascene pattern in which via holes and trenches are formed by via etching and trench etching and filled with copper as disclosed in U.S. Pat. No. 5,635,423 is known as proper for copper wiring.

However, the conventional method of forming damascene pattern has problems listed below.

One of the methods of forming damascene pattern is shown in FIGS. 1 and 2. To form a damascene pattern, as shown in FIGS. 1 and 2, a bottom wiring 10 is formed on a semiconductor substrate (not shown), a thick oxide layer 20 is deposited thereon, via holes 25 are formed in the oxide layer 20 using via etching, a bottom anti-reflection layer 30 is deposited on the surfaces of the oxide layer 20 and the via holes 25, and trenches (not shown) are formed using a mask pattern 40 for trench etching.

According to the above method of forming damascene pattern, the bottom anti-reflection layer 30 in the area A1 placed on the left side of FIG. 1, i.e. the area with low via hole density is deposited to become thicker than that in the other area A2 placed on the right side of FIG. 1, i.e. the area with high via hole density.

That is, the thickness T of the bottom anti-reflection layer 30 deposited on the area A1 with low via hole density exceeds the thickness T' on the area A2 with high via hole density.

In case that the thickness T and T' of the bottom anti-reflection layer 30 are different (T≠T'), width of a mask pattern 40 for trench etching in the area A1 with low via hole density becomes very different from that in the area A2 with high via hole density (W<<W') when the mask pattern 40 for trench etching is formed.

Therefore, the critical dimension CD of the damascene pattern 50 in the area A1 with low via hole density becomes very different from that in the area A2 with high via hole density (CD<<CD') due to the difference of the width of the mask pattern 40 for trench etching depending on via hole density as described above. In result, reliability of the device becomes low due to the low CD uniformity.

SUMMARY OF THE INVENTION

An aspect of the present invention is to provide a method of forming damascene pattern in a semiconductor device which is able to minimize the change of critical dimension of a damascene pattern by minimizing the change of thickness of a bottom anti-reflection layer depending on the via hole density.

According to an embodiment of the present invention, a method of forming damascene pattern in a semiconductor device, which includes forming an insulating layer on a bottom wiring, forming via holes exposing a part of the bottom wiring by removing the insulating layer selectively, filling insides of the via holes to a prescribed thickness, forming an anti-reflection layer on the via holes and the insulating layer, forming a mask pattern for trench etching on the insulating layer on which the anti-reflection layer is formed, and forming a damascene pattern using the mask pattern for trench etching, is provided.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein.

FIGS. 3–6 are sectional views illustrating process steps of a method of forming damascene pattern in a semiconductor device according to the present invention. In FIGS. 3–6, an area A1 placed on the left side is the area with low via hole density, and an area A2 placed on the right side is the area with high via hole density.

Figure 1:
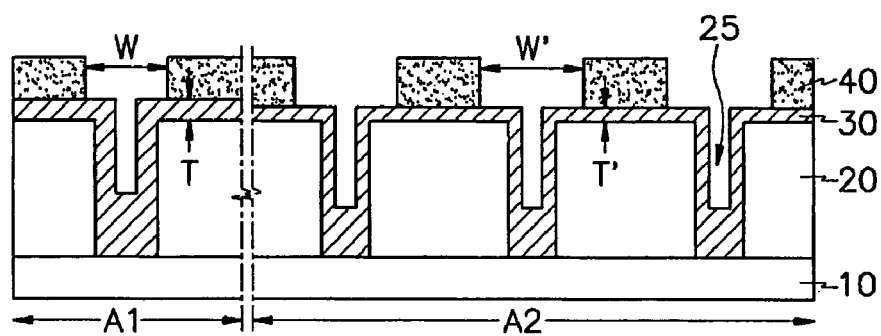
FIG. 1 is a sectional view for describing shortcomings of a conventional method of forming damascene pattern in a semiconductor device.
Figure 2:
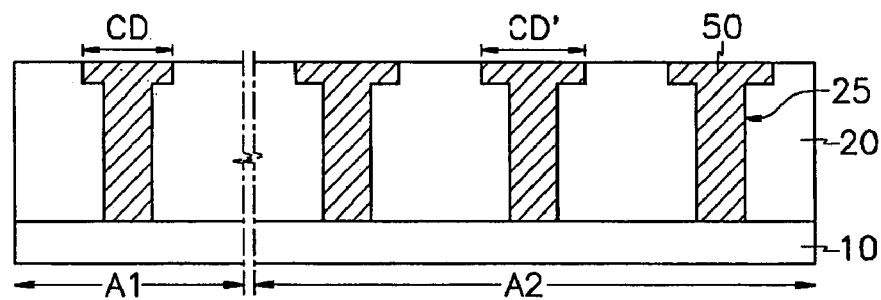
FIG. 2 is a sectional view showing a damascene pattern formed by the conventional method of forming damascene pattern in a semiconductor device.
Figure 3:
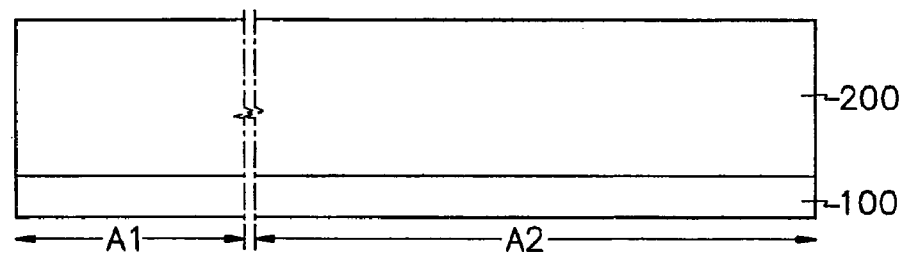
FIGS. 3–6 are sectional views illustrating process steps of a method of forming damascene pattern in a semiconductor device according to the present invention.

According to a method of forming damascene pattern in a semiconductor device according to an embodiment of the present invention, as shown in FIG. 3, an insulating layer 200 is formed by depositing an insulating material such as oxide on a bottom wiring 100 made of copper.

Figure 4:
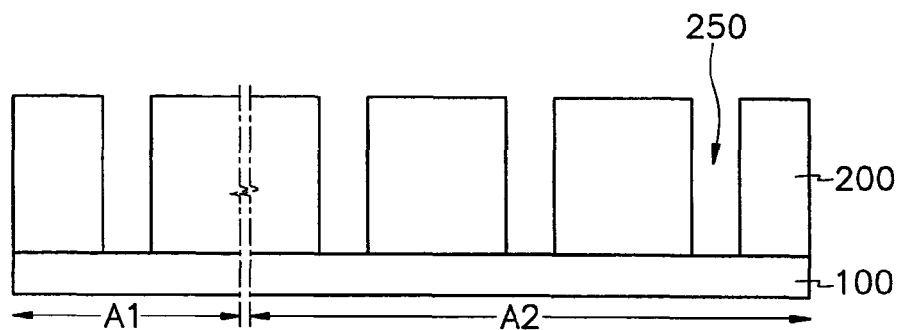

Next, a mask (not shown) having a prescribed form for via: etching is formed on the insulating layer 200, and the insulating layer 200 is removed selectively using the mask. Then, as shown in FIG. 4, via holes 250 exposing a part of the bottom wiring 100 are formed in the insulating layer 200.

Figure 5:
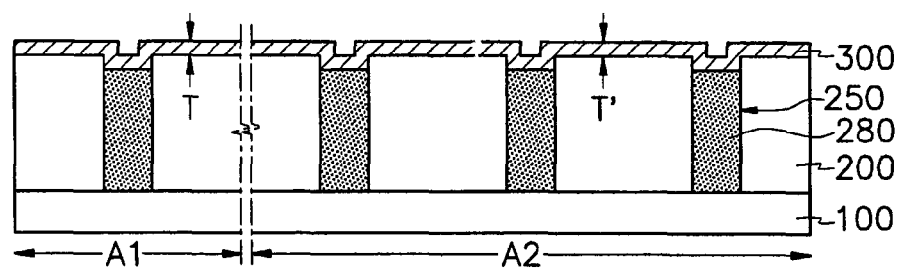

Subsequently, as shown in FIG. 5, insides of the via holes 250 are filled with a non-conductive material 280, preferably photoresist or oxide, to a prescribed thickness.

It will be described in more detail. First, a non-conductive material layer 280 is formed on the insulating layer 200 in which the via holes are formed. Next, the non-conductive material layer 280, is partly removed by entire surface dry etching or chemical-mechanical polishing (CMP) process to make the insulating layer 200 become exposed and to remain the non-conductive material layer 280 to a prescribed thickness insides the via holes 250.

Succeedingly, a bottom anti-reflection layer 300 which serves as a barrier to prevent the sidewalls of the via holes 250 and the bottom wiring 100 from getting damaged during etching process for forming trench is formed on the via holes 250 and the insulating layer 200.

Since the insides of the via holes 250 are filled with the non-conductive material 280 such as photoresist, thickness T of the bottom anti-reflection layer 300 in the area A1 with low via hole density has substantially no difference from the thickness T' in the area A2 with high via hole density (T≈T').

Figure 6:
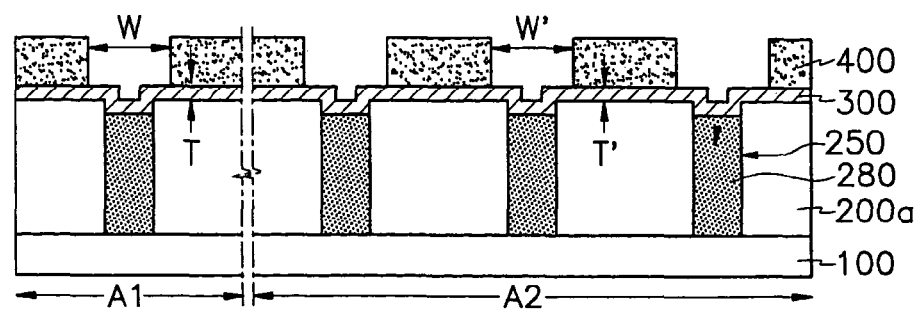

Next, as shown in FIG. 6, a mask pattern 400 for trench etching is formed on the insulating layer 200 on which the bottom anti-reflection layer 300 is formed.

According to the above-described method, since the thickness of the bottom anti-reflection layer 300 in the area A1 with low via hole density approximates the thickness of the bottom anti-reflection layer 300 in the area A2 with high via hole density (T≈T'), widths W and W' of the mask pattern 400 in the areas A1 and A2 become very close (W≈W').

Figure 7:
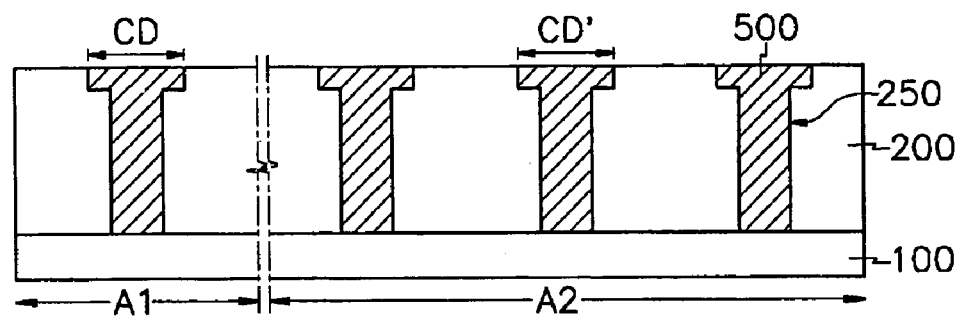
FIG. 7 is a sectional view of a damascene pattern formed by the method of forming damascene pattern in a semiconductor device of the present invention.

Therefore, as shown in FIG. 7, critical dimension CD of the damascene pattern in the area A1 with low via hole density and critical dimension CD' in the area A2 with high via hole density have close values (CD≈CD').

As described in the above, the method of forming damascene pattern in a semiconductor device according to the present invention has an advantage that CD uniformity is improved by minimizing the change of the critical dimension of the damascene pattern, thereby increasing reliability of the semiconductor device.

While the present invention has been described in detail with reference to the preferred embodiments, it is to be understood that the invention is not limited to the disclosed embodiments, but, on the contrary, is intended to cover various modifications and equivalent arrangements included within the sprit and scope of the appended claims.

What is claimed is:

1. A method of forming damascene pattern in a semiconductor device, the method comprising:
   forming an insulating layer on a bottom wiring;
   forming via holes that expose a part of the bottom wiring by removing the insulating layer selectively;
   filling insides of the via holes to a prescribed thickness using non-conductive material by forming a non-conductive material layer on the insulating layer in which the via holes are formed and selectively removing the non-conductive material layer to expose the insulating layer and allow the non-conductive material to remain for a prescribed thickness;
   forming an anti-reflection layer on the via holes and the insulating layer;
   forming a mask pattern for trench etching in the insulating layer on which the anti-reflection layer is formed; and
   forming a damascene pattern after forming trenches using the mask pattern.

2. The method of claim 1, wherein the non-conductive material layer is made of photoresist.

3. The method of claim 1, wherein said selective removal utilizes entire surface dry etching process or chemical mechanical polishing process.

* * * * *